United States Patent [19]

Call

[11] Patent Number: 4,494,080
[45] Date of Patent: Jan. 15, 1985

[54] VOLTAGE-CONTROLLED OSCILLATOR WITH INDEPENDENT GAIN AND FREQUENCY CONTROLS

[75] Inventor: Mark G. Call, Boulder, Colo.

[73] Assignee: International Business Machines Corporation, Armonk, N.Y.

[21] Appl. No.: 321,508

[22] Filed: Nov. 16, 1981

[51] Int. Cl.³ .................. H03K 3/03; H03J 7/04; H03K 3/282
[52] U.S. Cl. .................................. 331/8; 331/17; 331/108 D; 331/177 R
[58] Field of Search ............ 331/8, 16, 17, 25, 108 D, 331/177 R

[56] References Cited

U.S. PATENT DOCUMENTS

| | | | |
|---|---|---|---|
| 3,611,194 | 10/1971 | Codd et al. | 331/108 R |
| 3,870,971 | 3/1975 | Takahashi et al. | 331/108 D |
| 3,886,485 | 5/1975 | Takahashi | 331/108 D X |
| 3,904,988 | 9/1975 | Hsiao | 331/111 |
| 3,946,330 | 3/1976 | Takahashi | 331/8 |
| 4,007,429 | 8/1977 | Cadabra | 331/17 |
| 4,068,188 | 1/1978 | Yokoyama | 331/8 |
| 4,336,508 | 6/1982 | Cole et al. | 331/8 X |

FOREIGN PATENT DOCUMENTS 2089602 6/1982 United Kingdom .

OTHER PUBLICATIONS

Anon, "Voltage Controlled Oscillator", IBM Technical Disclosure Bulletin, Jan. 1971, vol. 13, No. 8, pp. 2170–2171.

*Primary Examiner*—Eugene R. LaRoche
*Assistant Examiner*—W. R. Paxman
*Attorney, Agent, or Firm*—Joscelyn G. Cockburn; Earl C. Hancock

[57] ABSTRACT

A voltage-controlled oscillator (VCO) comprises a current controlled oscillator (ICO) and control circuitry which independently adjusts the gain ($K_v$) and free-run or center frequency of the VCO. The control circuitry includes a first current source selected to set the free-run frequency of the VCO and a second current source selected to set the gain ($K_v$) of the VCO. The current sources are coupled to a common node in a summing/difference configuration. The controlled current generated from the summing/difference configuration is delivered into the ICO. Independent current mirrors are utilized to supply controlled current into the node of the summing/difference configuration.

5 Claims, 3 Drawing Figures

VOLTAGE-CONTROLLED OSCILLATOR WITH INDEPENDENT GAIN AND FREQUENCY CONTROLS

DOCUMENTS INCORPORATED BY REFERENCE

U.S. Pat. No. 4,007,429 is hereby incorporated by reference as describing a complete phase-locked loop.

U.S. Pat. No. 3,904,988 is hereby incorporated by reference as showing a detailed circuit of a voltage-controlled oscillator (VCO).

"Voltage-Controlled Oscillator," D. F. Cox, IBM Technical Disclosure Bulletin, Vol. 13, No. 8, January 1971, pp. 2170–2171 is hereby incorporated by reference as showing another VCO circuit useful in practicing the invention.

BACKGROUND OF THE INVENTION

1. Field of the Invention

The present invention relates to phase-locked loops (PLL) in general, and, more particularly, to PLL having circuits which optimize the acquisition time of said loops and control the tracking characteristics.

2. Prior Art

The use of phase-locked loops (PLLs) in the field of electromechanical control, data acquisition, etc. is well known in the prior art. A typical PLL consists of a phase detector, a low-pass filter and a voltage-controlled oscillator (VCO). The enumerated elements are coupled to form a closed-loop system. The phase detector measures differences in phase between an incoming signal and a feedback signal from the VCO. Any detected differences generate an error signal which is filtered and is supplied to the VCO. The VCO utilizes the error signal so as to minimize the frequency difference between the feedback signal and the incoming signal.

Many applications require that the PLL have a tight frequency control, short acquisition or lock time, and relatively wide lock frequency range. Unfortunately, these requirements are mutually exclusive. Therefore, a design which tends to achieve one of the above requirements tends to adversely affect the others.

U.S. Pat. No. 4,007,429 describes a phase-locked loop with a switched low-pass filter. The switched low-pass filter has two different bandwidths. One of the bandwidths has a wide frequency response for use during acquisition period. The other bandwidth has a relatively narrow frequency response and is used during normal tracking for tight control of the voltage-controlled oscillator. A loss-of-lock detector controls the particular filter bandwidth state by causing certain filter components to be switched in and out according to the presence or absence of phase-lock condition.

SUMMARY OF THE INVENTION

Accordingly, it is a broad object of the present invention to provide a PLL which is more efficient than has heretofore been possible.

More particularly, it is the object of the present invention to provide a PLL which has a relatively wide lock frequency range, a relatively short acquisition time, and tight frequency control during the period when the loop is locked.

The above and other objects of the present invention are achieved by two electrical circuits which are coupled in the PLL and independently adjust the gain (Kv) and the free run or center frequency of the VCO. The PLL includes a phase detector, a loop filter, an amplifier, and a VCO. The VCO includes a current-controlled oscillator (ICO) connected in series to the two electrical circuits. The electrical circuits are coupled in a summing/difference configuration. The current which is generated from the summing/difference configuration drives the ICO. Independent current mirrors are utilized to deliver the current from the independent circuits into the common node of the summing/difference configuration.

In one embodiment of the present invention, the input circuits are current sources.

In another embodiment of the invention, the input circuits are voltage sources coupled in series with resistors.

In yet another feature of the invention, the PLL is fabricated in a module or chip utilizing integrated circuit technology. The two circuit controllers are generated from non-integrated circuit technology and are disposed off the chip. By having non-integrated circuit controllers off the chip, the PLL is transformed into a universal chip which may be used for different applications, etc.

The foregoing and other objects, features and advantages of the invention will be apparent from the following more particular description of the preferred embodiment of the invention as illustrated in the accompanying drawings.

DETAILED DESCRIPTION OF THE PREFERRED EMBODIMENT

The present invention describes an improved phase-locked loop having an improved voltage-controlled oscillator (VCO) therein. The VCO includes a current-controlled oscillator (ICO) coupled to an input controller. The input controller comprises a circuit means which is coupled in a summing/difference configuration and generates current which sets the gain and/or free-run frequency ($F_{Fr}$) of the ICO. The circuits operate so that the setting of the VCO gain ($K_v$) and/or the free-run frequency are mutually independent.

The phase-locked loop, according to the present invention, is a universal loop in that a single loop can be used for matching a plurality of different frequencies. To this end, the component of the phase-locked loop including the ICO can be fabricated on a chip using integrated circuit technology whereas the input controller to the ICO is generated off the chip. This universal characteristic of the described phase-locked loop presents a different feature to a user which was not present in the prior art.

Figure 1:
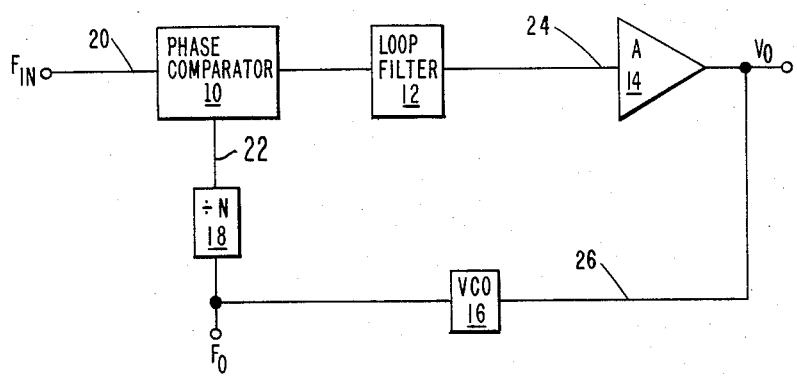
FIG. 1 is a schematic of a prior art PLL.

FIG. 1 shows a prior art phase-locked loop. The loop consists of the conventional loop components: phase comparator 10, loop filter 12, amplifier 14, VCO 16, and a divide-by-N circuit 18. The input signal $F_{in}$ is applied on conductor 20 to the phase comparator 10. The phase comparator 10 generates an error signal which is proportional to the difference in phase between the input signal on conductor 20 and the phase of the output signal fed back to the comparator on conductor 22. This error signal is then applied to loop filter 12. The unwanted frequency is filtered out of the signal and the signal is fed over conductor 24 into amplifier 14. The signal is amplified in amplifier 14 and is fed over conductor 26 to VCO 16. The signal on conductor 26 is a voltage signal and is identified as $V_o$. The VCO is a conventional device which accepts a voltage signal and generates a signal whose frequency is proportional to the input voltage signal. The signal $F_o$ which is generated by VCO 16 is supplied to an optional divide circuit 18. The function of the divide-by-N circuit 18 is to reduce the frequency of the signal generated by the VCO. The divided frequency is compared to the input signal $F_{in}$. If the signals are out of phase, an error signal is generated by the phase comparator. A more detailed description of a PLL is given in the above-described U.S. Pat. No. 4,007,429, incorporated by reference herein. It should be noted that when the signals on conductors 20 and 22 are in phase, the VCO is operating at its free-run center or midpoint frequency.

It should be noted that the loop gain for the PLL may be expressed by the following expression:

Loop gain = $AK_pK_cK_v$ where

A represents the gain of the amplifier,
$K_p$ represents the gain of the phase detector,
$K_c$ represents the gain of the loop filter, and
$K_v$ represents the gain of the VCO.

It has been observed that closed-loop PLL performance is highly dependent on the loop gain. To this end, once a PLL has been designed to match a particular use, any attempt to use the loop for another purpose is very difficult because any attempt to change any of the components in the loop affects the gain and so modifies the loop characteristics. Other PLL characteristics which are affected by loop gain are: time-to-lock, lock range, lock acquisition range, and bandwidth. Since all of these functions depend on loop gain, any attempt to utilize a PLL for a use other than that for which it was designed requires significant redesign, due to the engineering tradeoffs required for optimization of the prior art PLL. This process made circuit integration of significant portions of the PLL difficult for many applications and resulted in long redesign and fabrication lead-times.

It has been determined that by controlling the VCO so that the gain ($K_v$) and/or the free-run frequency ($F_{fr}$) can be adjusted independently, a single phase-locked loop could be utilized for various applications. Moreover, by independently adjusting the free-run frequency and the gain of the VCO, preferably by circuits external to the loop, the overall gain of the loop is maintained constant and does not affect the overall performance of a loop. This determination is the basis for the present invention. Also, this determination made it more practical for the loop to be manufactured with integrated circuit technology.

Figure 2:
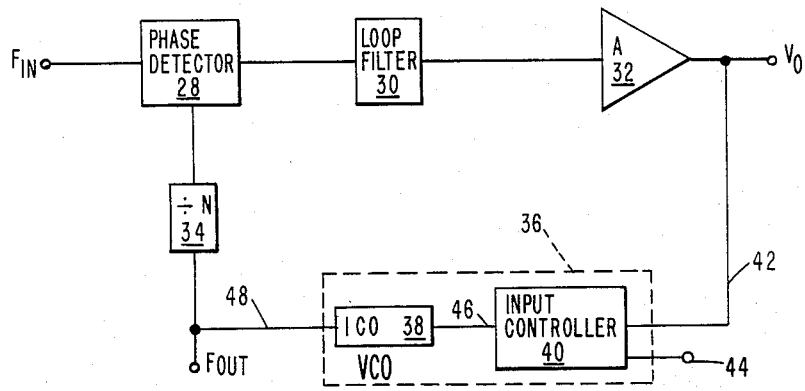
FIG. 2 is a block diagram of a PLL with the improved VCO in accordance with the present invention.

FIG. 2 shows an improved phase-locked loop according to the teaching of the present invention. The conventional elements of the loop are phase detector 28, loop filter 30, amplifier 32 and divide circuit 34. The functions of these elements are substantially the same as the previously described conventional loop elements and, therefore, will not be described here. Besides the conventional components of the phase-locked loop is the improved VCO, identified by numeral 36. The VCO 36 includes a current-controlled oscillator 38 (ICO) and an input controller 40. The input controller 40 is characterized by two inputs. One of the inputs is the feedback error voltage signal on conductor 42 and the other input is on conductor 44 and is coupled to a reference signal. The output from input controller 40 is fed over conductor 46 to control the ICO. The output from ICO 38 is fed over conductor 48 into the divide circuit 34. The output signal from input controller 40 independently sets the gain ($K_v$) and/or the free-run frequency of the ICO. It should be noted that the electrical circuits of the ICO are the same as the electrical circuits of a conventional VCO. By way of example, U.S. Pat. No. 3,904,988, incorporated herein by reference describes the circuits for a VCO. Also, the article entitled "Voltage-Controlled Oscillator" by Cox in the IBM Technical Disclosure Bulletin, incorporated herein by reference, Vol. 13, No. 8, January 1971 describes a voltage-controlled oscillator of the type which can be used in the present invention. Therefore, the details of the ICO will not be given. However, whereas in the conventional loop the error signal is fed directly into the VCO, in the improved loop according to the present invention, the error voltage is processed prior to its application to the ICO.

Figure 3:
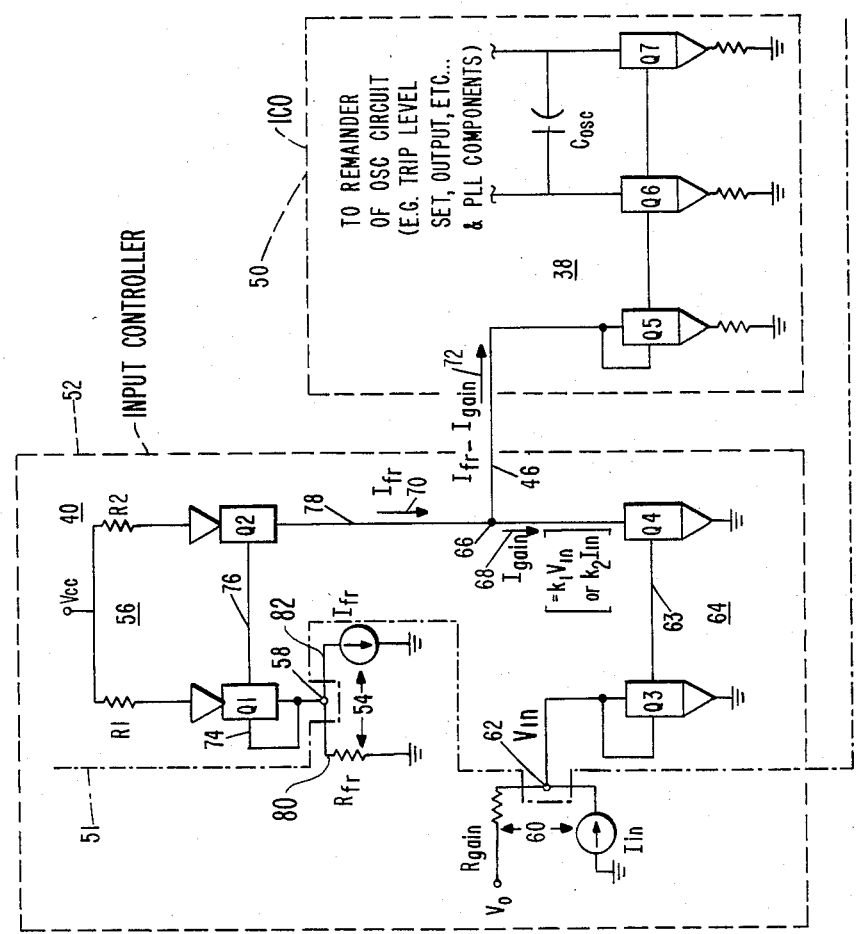
FIG. 3 is a schematic of the electrical circuit for the improved VCO.

A schematic of the electrical circuit which forms the improved VCO is shown in FIG. 3. The portion of the schematic which is enclosed by the block 50, represents a partial showing of the ICO. The elements enclosed by block 52 identify the electrical components of input controller 40 (FIG. 2). As was stated previously, the partial ICO shown in block 50 includes electrical circuits substantially identical to a conventional VCO. However, in the conventional VCO, a voltage signal is supplied to the VCO. With the ICO of the present invention, a current is supplied. Since the components of the ICO are substantially identical to those of the VCO, details of the complete ICO circuit are not shown in the figure. It is rated that the oscillatory capacitor ($C_{OSC}$) is driven by a current mirror comprising Q5 and Q6. As such, the current generated by input controller 40 is fed over conductor 46 to the ICO 38. Of course, only a portion of the electrical elements of ICO 38 is shown in FIG. 3. It should be understood that the balance of the circuit is substantially the same as a conventional VCO.

As shown in FIG. 3, the input controller 40 includes either of external circuit means 54 connected at node 58 to a current mirror 56. The current $I_{FR}$ which is produced by current mirror 56 is set by one of the external circuit means 54. This current, $I_{FR}$ is utilized to set the free-run frequency of the ICO.

Similarly, either of a second external circuit means 60 is connected at node 62 to current mirror 64. The current $I_{gain}$, which is produced by the current mirror 64, sets the desired gain ($K_v$) of the ICO. The components 54, 56, 60 and 64 are coupled in a summing/difference configuration at node 66. With this configuration, the current $I_{gain}$ flows in the direction shown by arrow 68 while the current $I_{FR}$ flows in the direction identified by arrow 70. As a result, the current which is supplied on conductor 46 is equivalent to ($I_{FR} - I_{gain}$). The external circuit means 54 comprises either a resistor $R_{FR}$ coupled at one end to a ground (or a reference potential,) and at the other end to node 58 or a current source $I_{FR}$ coupled to node 58. The current mirror 56 includes a pair of PNP transistors Q1 and Q2. The base of transistor Q1 is coupled by conductor 74 to the collector of the same transistor. The emitter of transistor Q1 is connected through R1 to a supply voltage $V_{CC}$. The base of transistor Q1 is tied by conductor 76 to the base on transistor Q2. The emitter of transistor Q2 is tied through resistor R2 to the supply voltage $V_{CC}$. The collector of transistor Q2 is coupled to node 66 by conductor 78. It should be noted that the input node 44 (FIG. 2) is the same as node 58 (FIG. 3). If the input (external circuit) 54 is represented by the resistor $R_{FR}$, conductor 80 (FIG. 3) and conductor 44 (FIG. 2) are identical. Similarly, if the current source $I_{FR}$ is utilized as an external circuit means 54, conductor 82 is identical to conductor 44.

In FIG. 3, the external circuit 60 comprises either an external resistor $R_{gain}$ or a current source $I_{IN}$. In operation either one, but not both, is coupled to terminal 62. It should be noted that the signal $V_o$, which is supplied to $R_{gain}$, is identical to the signal $V_o$ in FIG. 2. The current which is supplied to node 62 is coupled into the summing/difference node 66 by current mirror 64. The current mirror 64 includes a pair of NPN transistors Q3 and Q4, respectively. The bases of transistors Q3 and Q4 are coupled by conductor 63. The emitter of both transistors are tied to ground or some reference potential. The collector and emitter of Q3 are connected. As can be seen from the configuration, the current $I_{gain}$ is equivalent to $K_1 V_{IN}$ or $K_2 I_{IN}$ (with K being a constant in the expression) where $V_{IN}$ is the signal at node 62. It should be noted that when $V_o$ (the instantaneous error signal, is at its median voltage, the VCO oscillates at its free-run frequency, $F_{FR}$. As was stated previously, one attribute of the present invention is that it allows a single PLL to be utilized universally, that is for more than one set of frequencies. In such a configuration, a plurality of selectable resistors $R_{FR}$ or $I_{FR}$ current sources can be coupled to node 58.

Also, the PLL, according to the invention, is more adaptable for fabrication using integration technology. To this end, a portion of the PLL including the current mirrors 56, 64 and the other elements of the loop, blocked off by lines 51 and 52 including the phase detector, loop filter, ICO, amplifier and the divide circuit are fabricated on a chip. The input terminal into the chip would be nodes 58 and 62. The external circuit 54 and 60 need not be integrated on the module. By attaching different resistors or $I_{FR}$ current sources at node 58, the module could be adapted for several different uses.

Although described and illustrated as implemented with unidirectional current sources, no limitation thereto is intended. As is understood by those skilled in the art, the summing/difference configuration means that bidirectional current sources are also useful in practicing the invention.

The improved PLL, according to the teaching of the present invention, provides fast lock time, wider frequency response, and narrow filter bandwidth by means of multiple mode operation.

While the above invention has been particularly shown and described with reference to a preferred embodiment thereof, it will be understood by those skilled in the art that various changes in form and details may be made therein without departing from the spirit and scope of the invention.

What is claimed is:

1. An improved phase-locked loop comprising:
    comparator means for comparing a first and a second signal, wherein said first signal is a signal for establishing a phase standard, for generating an error signal indicative of any phase difference between said first and second signals;
    filter means having an input coupled to receive the error signal from said comparator means for generating a first control signal;
    a first circuit means for generating a second control signal, said first circuit means including:
        (a) a supply voltage source having first and second terminals;
        (b) a current mirror circuit means coupled to one of said voltage source terminals and having an output for supplying said second control signal; and
        (c) a resistor coupling the input of said current mirror circuit means to the other of said voltage source terminals;
    an oscillator for producing an output signal with a frequency and gain determined by an input signal thereto;
    means for deriving said second signal for said comparator means from said oscillator output signal;
    a second circuit means responsive to said first control signal from said filter means for selectively producing a third control signal for controlling the gain of said oscillator;
    means combining said second and third control signals into a summing/difference signal; and
    means for deriving the input signal to said oscillator from said summing/difference signal whereby said phase-locked loop has its free-run frequency set by the first circuit means and the gain set by the second circuit means.

2. The improved phase-lock loop of claim 1 wherein the resistor is of a value selected to set the free-run frequency ($F_{FR}$) of the oscillator.

3. An improved phase-locked loop comprising:
    comparator means for comparing a first and a second signal, wherein said first signal is a reference frequency signal, and for generating an error signal indicative of any phase difference between said first and second signals;
    filter means having an input coupled to receive the error signal from said comparator means for generating a first control signal;
    a first circuit means responsive to a reference control signal to generate a second control signal for establishing the free-run frequency of the loop;
    an oscillator for producing an output signal with a frequency and gain determined by an input signal thereto;
    means for deriving said second signal for said comparator means from said oscillator output signal;
    a second circuit means responsive to said first control signal from said filter means for selectively producing a third control signal, the second circuit means including:
        (a) a supply voltage source; and
        (b) a first current mirror connected to said supply voltage source, having an input connected to said first control signal and having an output for supplying said third control signal;
    means combining said second and third control signal into a summing/difference signal; and
    means deriving the input signal to said oscillator from said summing/difference signal whereby said phase-locked loop has its free-run frequency set by the first circuit means, and the gain set by the second circuit means.

4. An improved phase-locked loop in accordance with clai 3 wherein said first circuit means includes:
   (a) a second current mirror connected to said supply voltage source; and
   (b) means deriving the input for said second current mirror from said reference control signal for producing said second control signal as the output of said second current mirror.

5. An improved phase-locked loop (PLL) module comprising:
   an integrated section of said module including:
   a phase comparator;
   a loop filter connected to the output of the phase comparator;
   a current-controlled oscillator having its output coupled to an input of the phase comparator;
   a first current mirror means;
   a second current mirror means;
   said first and second current mirror means coupled in a summing/difference configuration to generate a controlled signal to drive the oscillator; and
   a nonintegrated section including a pair of electrical circuits, one of which is coupled to the input of said first current mirror means to set the gain $K_v$ and the other of which is coupled to said second current mirror means to set the center frequency of the oscillator.

* * * * *